United States Patent
Liu et al.

(10) Patent No.: US 10,698,320 B2
(45) Date of Patent: Jun. 30, 2020

(54) METHOD FOR OPTIMIZED WAFER PROCESS SIMULATION

(71) Applicant: Taiwan Semiconductor Manufacturing Co., Ltd., Hsin-Chu (TW)

(72) Inventors: Ru-Gun Liu, Zhubei (TW); Shih-Ming Chang, Hsin-Chu (TW); Shuo-Yen Chou, Hualien County (TW); Zengqin Zhao, Zhubei (TW); Chien Wen Lai, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 672 days.

(21) Appl. No.: 15/427,496

(22) Filed: Feb. 8, 2017

(65) Prior Publication Data
US 2018/0165388 A1 Jun. 14, 2018

Related U.S. Application Data

(60) Provisional application No. 62/434,234, filed on Dec. 14, 2016.

(51) Int. Cl.
*G03F 7/20* (2006.01)
*G03F 9/00* (2006.01)
*H01L 23/544* (2006.01)

(52) U.S. Cl.
CPC ............. *G03F 7/705* (2013.01); *G03F 9/708* (2013.01); *H01L 23/544* (2013.01); *H01L 2223/54426* (2013.01)

(58) Field of Classification Search
None
See application file for complete search history.

(56) References Cited

U.S. PATENT DOCUMENTS 7,974,728 B2  7/2011  Lin et al.
8,477,299 B2  7/2013  Wu et al.
(Continued)

OTHER PUBLICATIONS

Shiu, Weicheng et al, "Advanced Self-Aligned Double Patterning Development for Sub-30-nm DRAM Manufacturing", Mar. 16, 2009, SPIE Advanced Lithography, SPIE. (Year: 2009).*

(Continued)

*Primary Examiner* — Cedric Johnson
(74) *Attorney, Agent, or Firm* — Haynes and Boone, LLP

(57) ABSTRACT

A method includes establishing a simulation process for simulating fabrication of a structure on a wafer. The simulation process includes multiple simulation steps for simulating multiple wafer fabrication steps respectively, and further includes a step of testing the structure that produces a result representing quality of the structure. Each of the simulation steps has a respective adjustable process parameter. The method further includes specifying a respective workable range for each process parameter and running the simulation process in iterations using a wafer process simulator until the result becomes optimal. During the running of the simulation process, every two consecutive iterations either adjust two different process parameters within their workable ranges or adjust a same process parameter at opposite directions within its workable range.

20 Claims, 8 Drawing Sheets

(56) References Cited

U.S. PATENT DOCUMENTS

2008/0163148 A1* 7/2008 Scheffer .............. G06F 17/5009
716/51
2011/0243424 A1 10/2011 Wu et al.
2014/0323323 A1* 10/2014 Cunningham ....... G01N 21/648
506/9

OTHER PUBLICATIONS

He, Feng et al., "Analysis of Alignment Modeling for Nikon Steppers", 2009, IEEE Proceedings of 16th IPFA, IEEE. (Year: 2009).*

* cited by examiner

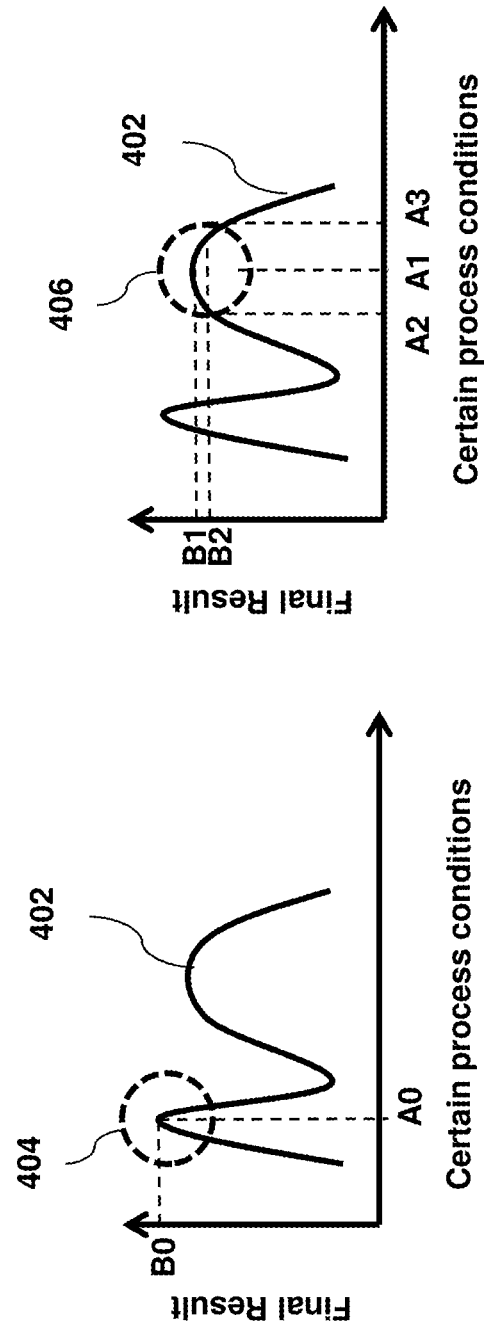

METHOD FOR OPTIMIZED WAFER PROCESS SIMULATION

PRIORITY

This application claims the benefits of U.S. provisional application Ser. No. 62/434,234, entitled "METHOD FOR OPTIMIZED WAFER PROCESS SIMULATION," filed Dec. 14, 2016, herein incorporated by reference in its entirety.

BACKGROUND

Semiconductor integrated circuits (IC) are typically formed by performing a sequence of fabrication steps applied to a silicon wafer. For example, the fabrication steps may include photolithography, etching, film deposition, and so on. Processing conditions at various steps may negatively or positively affect the final IC device's performance. The negative effects could be a smaller process window, a lower image contrast, a smaller Depth Of Focus (DOF), and a higher Mask Error Enhancement Factor (MEEF). In contrast, the positive effects could be a larger process window, a higher image contrast, a larger DoF, and a lower MEEF. Furthermore, processing conditions at one step may affect or be affected by another fabrication step. Finding a combination of processing conditions for multiple steps that yields an optimal result on the final IC can be a challenging task.

Traditionally, such a finding has been made by trial and error. Recently, computer simulation tools have been developed to reduce the guesswork in the above process. However, existing approaches are not completely satisfactory. For example, typically only one process condition is input to the simulation tool, which makes the process of tuning multiple parameters a time-consuming task. Further, such approach may overlook dependencies among process parameters, and may fail to find the optimal combination of process conditions. Still further, how to build a simulation model that closely matches a real IC device is also a challenging task. Improvements in these areas are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4, 5, and 6 illustrate examples of optimized test results, according to aspects of the present disclosure.

DETAILED DESCRIPTION

Figure 1:
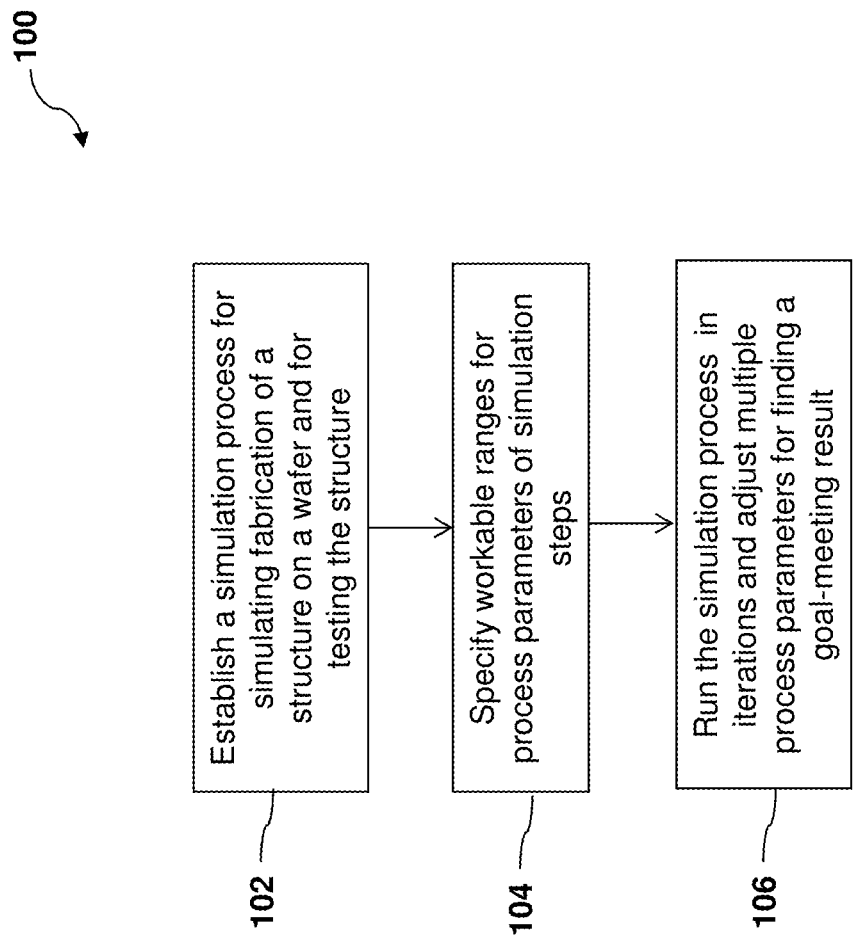
FIG. 1 is a flow chart of a method for simulating semiconductor fabrication according to some aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods and computerized tools for simulating wafer fabrication. More particularly, the present disclosure is related to optimizing or co-optimizing multiple process parameters in an efficient manner.

According to an embodiment of the present disclosure, multiple result-effecting process parameters are selected and adjusted in small steps until a target goal of a semiconductor structure on a wafer (e.g., silicon wafer) is reached in the simulation. The semiconductor structure may be an interconnect structure, an alignment mark, a transistor, or other suitable devices or structures in or on the wafer. The target goal of the simulation depends on the structure to be fabricated. For example, if the structure is a part of an interconnect structure, the target goal may be an electrical characteristic of the interconnect structure such as resistance or capacitance. If the structure is an alignment mark, the target goal may be the reflectivity of the alignment mark. In embodiments, the target goal can be a globally optimal result or a result that permits a wide range of process variations. The former leads to the best-performing devices and the latter leads to the most robust fabrication processes.

The present disclosure is also related to improvements in computerized wafer simulation tools. For example, a wafer simulation tool may implement various modules according to the present disclosure and the various modules simulate a partial or complete set of wafer fabrication steps. Some of the modules have adjustable process parameters. The wafer simulation tool may take multiple process parameters as inputs, and adjust the process parameters with small steps in an iterative manner until it reaches a user-specified simulation goal. In the iterative simulation processes, the multiple process parameters are tuned pseudo-simultaneously, allowing the simulation tool to consider interdependencies among the process parameters. This improves the simulation tool's speed to converge to the simulation goal which may be an optimal result or a result that permits a wide range of process variations.

FIG. 1 is a flowchart of a method 100 for simulating wafer fabrication according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. In the embodiment shown, the method 100 includes operations 102, 104, and 106. Stated briefly, the operation 102 establishes a simulation process for simulating fabrication of a structure on the wafer and for testing the structure; the operation 104 specifies workable ranges for process parameters of various simulation steps in the operation 102; and the operation 106 runs the simulation process in iterations and adjusts multiple process parameters for finding a goal-meeting result. The operations 102, 104, and 106 are further discussed below.

At the operation 102, the method 100 establishes a simulation process for simulating fabrication of a structure on a wafer. The simulation process may include any number of fabrication steps, and the structure can be an intermediate IC product, a final IC product, a test device, an overlay mark, an alignment mark, or other suitable structure(s) in or on a wafer. For example, the fabrication steps may include preparing a wafer, doping a wafer with impurities, creating active regions and isolation regions on a wafer, forming doped regions for transistors, forming gate structures, forming contact features, forming interconnect structures, depositing films onto a wafer, spin coating a photoresist layer, performing photolithography, etching trenches, and other suitable manufacturing steps.

In the present embodiment, the simulation process at the operation 102 includes a step of testing the structure at the end of the fabrication (which can be an intermediate fabrication step in the process of forming an integrated circuit for example). The result of the testing represents certain quality of the structure. For example, if the structure is an interconnect, the result may be a delay of an electrical signal through the interconnect. For another example, if the structure is an alignment mark, the result may be a reflectivity of the alignment mark.

In the simulation process, at least some of the fabrication steps can be tuned by adjusting some process parameters (or process conditions) associated therewith. For example, in a step of coating a photoresist layer, the thickness of the photoresist layer can be adjusted within a workable range. This workable range may be provided by a semiconductor manufacturer or by a designer during experimental phases, based on, e.g., the photoresist material, the properties of the material layers underneath the photoresist layer, the radiation source of the photolithography process, the properties of the developing chemicals, and other factors. For another example, in a step of etching trenches into the wafer, the depth of etching can be adjusted within a workable range. This workable range may be provided by a semiconductor manufacturer or by a designer during experimental phases, e.g., based on the material to be etched, etch selectivity, etching recipe including etching time and temperature, and other factors.

At the operation 104, the method 100 identifies the process parameters that can be adjusted (so-called "adjustable process parameters"), and specifies a respective workable range for each of the process parameters, as discussed above. Each workable range may be specified as a number of discrete values, or as a continuous range between a minimum value and a maximum value and one or more deltas for adjusting the respective process parameter. For example, it may specify different deltas for opposite directions (increment and decrement), or different deltas at the center and boundaries of the range. In the present embodiment, the deltas are small relative to the workable range. For example, it may be only 10% or less of the workable range in some embodiments. The adjustable process parameters and their associated workable ranges will be further discussed throughout the present disclosure.

In the present embodiment, the operation 106 includes a simulation loop controller. The simulation loop controller initializes various process conditions for the simulation process and controls the running of the simulation process. The simulation loop controller also checks whether or not the result of the simulation meets certain goal. If the result does not meet the goal, the simulation loop controller repeats the simulation after adjusting some process parameter(s). The loop of simulating the fabrication of the structure, testing the structure to produce the result, and checking the result against the goal continues iteratively until the goal is reached or another criterion (e.g., timeout) is reached. In each iteration, at least one process parameter is adjusted up or down from its current value and is maintained within its workable range. The increment or decrement is by the delta specified in the operation 104 if the workable range is continuous or by the discrete values.

Figure 2:
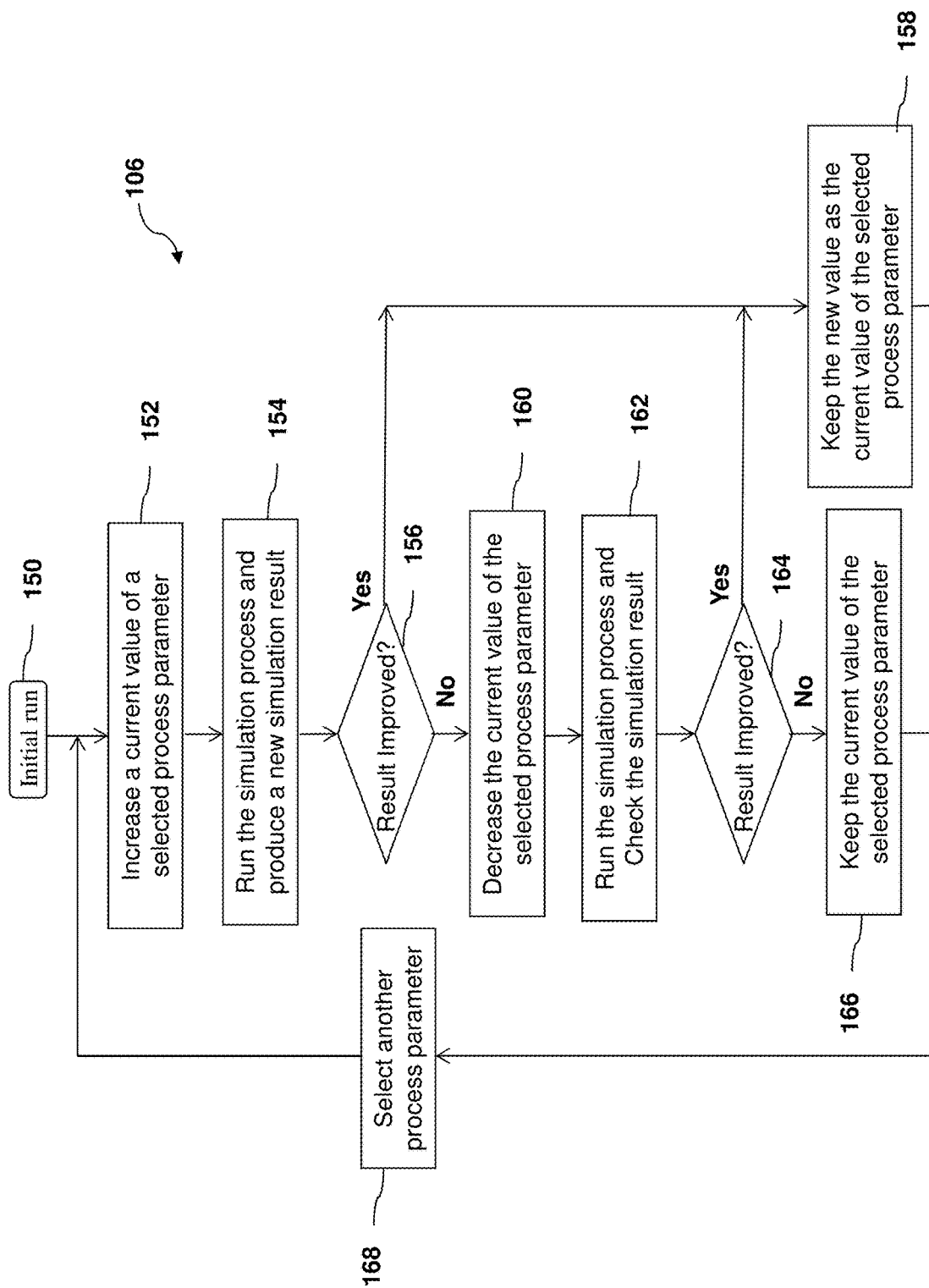
FIG. 2 illustrates a flow chart of a method for adjusting one or more process parameters in a wafer simulation process, according to aspects of the present disclosure.

FIG. 2 illustrates a flow chart of an embodiment of the simulation loop controller at the operation 106, which is discussed below. Referring to FIG. 2, after an initial simulation run at block 150, the method 100 selects an adjustable process parameter and increases its current value by a delta to get a first new value. The delta is a small portion of the workable range of the selected process parameter. With the process parameter assigned with the first new value, the method 100 runs the simulation process and produces a new result at block 154. The method 100 checks the new result at block 156. If the new result improves over the previous result, the first new value is kept as the current value of the selected process parameter at block 158. If the new result does not improve over the previous result, the method 100 discards the first new value and decreases the current value of the process parameter by the delta at block 160 to get a second new value. With the process parameter assigned with the second new value, the method 100 runs the simulation process again and produces a second new result at block 162. The method 100 checks the second new result at block 164. If the second new result improves over the previous result (produced by previous loop of operation 106 or the initial run 150), the second new value is kept as the current value of the selected process parameter at block 158. If the second new result does not improve over the previous result, the method 100 discards the second new value and keeps the current value of the selected process parameter at block 166. This completes the current iteration. At the next iteration, a different process parameter is selected at block 168, and the above process repeats. In various embodiments, the block 152 may increase the current value by a delta and the block 160 may decrease the current value by a delta. The blocks 152 and 160 always adjust the selected process parameter at opposite directions. However, the amount of adjustments in these two blocks may be the same or different in various embodiments.

In the present embodiment, since each iteration of the simulation only changes one process parameter by relatively small amount, the method 100 is able to fully explore the solution space defined by the multiple process parameters as the variables. In contrast, in another embodiment, the method 100 may fully optimize one process parameter while keeping all other parameters unchanged. This may speed up the overall simulation process, but the result may not be globally optimal. This is because optimizing one process parameter with all other parameters fixed is analogous to one-dimensional optimization, and the solution space is unnecessarily limited. In the present embodiment, all the process parameters are optimized at approximately the same time by changing each process parameter slightly in each iteration moving towards an optimal result. In other words, the process parameters are optimized pseudo-simultaneously.

Figure 3:
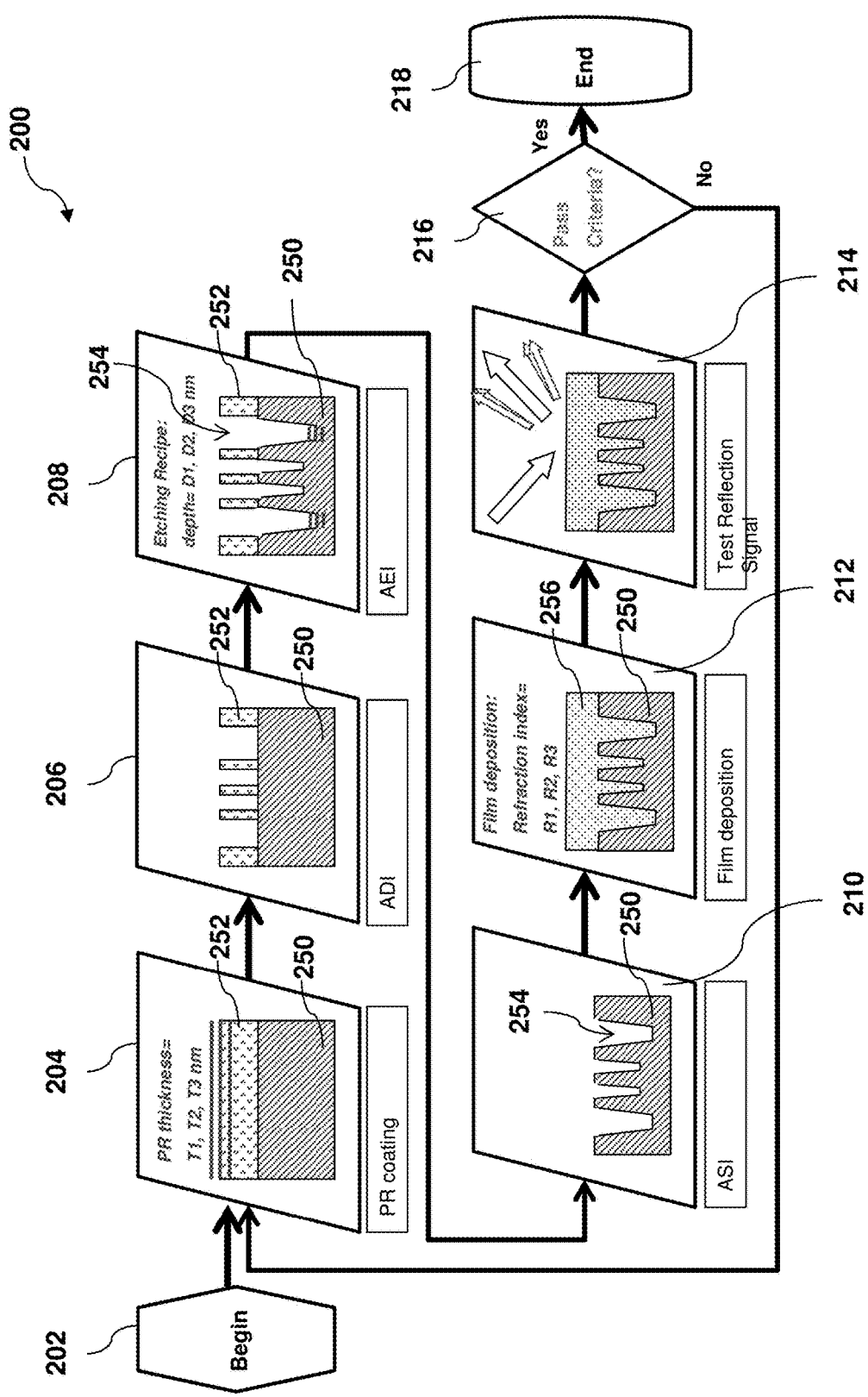
FIG. 3 illustrates a flow chart of a wafer simulation process, according to aspects of the present disclosure.

FIG. 3 illustrates a flow chart of a method 200 for simulating a wafer fabrication process according to aspects of the present disclosure. The method 200 is an embodiment of the method 100. The embodiment of the method 200 as shown in FIG. 3 has a specific application in fabricating one or more alignment marks on a wafer. Embodiments of the method 200 may also be used for simulating the fabrication of semiconductor structures other than alignment marks. The method 200 includes operations 202, 204, 206, 208, 210, 212, 214, 216, and 218. Stated briefly, the operation 202 initializes the simulation process, the operation 204 simulates a step of coating a photoresist layer, the operation 206 simulates a step of photolithography, the operation 208 simulates a step of etching trenches, the operation 210 simulates a step of stripping the photoresist layer, the operation 212 simulates a step of depositing a film into the trenches, and the operation 214 simulates a step of testing the structure, e.g., alignment marks. Operation 216 checks the result of testing and operation 218 finishes the simulation process. Additional operations can be provided before, during, and after the method 200, and some operations described can be replaced, eliminated, or moved around for additional embodiments of the method. Each of the operations 202-218 is further discussed below.

At the operation 202, the method 200 initializes the simulation process. For example, it may select a wafer (not shown) and various material layers 250 on the wafer where the structure (e.g., an alignment mark) is to be formed, including the size and/or the material of the wafer, and the material and thickness of the various material layers 250. In an embodiment, the material layers 250 may include uneven topography. For example, a first region of the material layers 250 may be lower or higher than a second region of the material layers 250. This is for simulating the effects of practical semiconductor fabrication as layers of a wafer may not be made perfectly flat.

At the operation 204, the method 200 simulates a step of coating a photoresist layer 252 onto the material layers 250 on the wafer. The operation 204 has one or more adjustable process parameters. For example, a thickness of the photoresist layer 252 may be an adjustable process parameter having a first workable range. In the present embodiment, the first workable range includes a number of discrete thicknesses. For example, the first workable range may include a minimum thickness, a maximum thickness, and one or more thicknesses between the minimum thickness and the maximum thickness. These thicknesses may be provided by a semiconductor manufacturer based on empirical data or by a designer during experimental phases. In the embodiment as shown in FIG. 3, the first workable range includes a minimum thickness of T1 (e.g., 65 nm), a maximum thickness of T3 (e.g., 75 nm), and an intermediate thickness of T2 (e.g., 70 nm) as an example. In an alternative embodiment, the first workable range may be specified as a continuous range between a minimum thickness and a maximum thickness, and further include a delta thickness for tuning the thicknesses in this range. In addition to or alternative to the thickness of the photoresist layer 252, the operation 204 may include other adjustable process parameters of the photoresist layer 252.

At the operation 206, the method 200 simulates a step of photolithography for forming patterns into the photoresist layer 252. The operation 206 may have one or more adjustable process parameters, such as the contrast between line and space patterns in the resist pattern 252, line edge roughness of the resist pattern 252, line width roughness of the resist pattern 252, resist film loss during photolithography and developing, and the vertical profile (e.g., the sidewall angle and the aspect ratio) of the resist pattern 252.

At the operation 208, the method 200 simulates a step of etching the material layers 250 using the resist pattern 252 as an etching mask, thereby forming trenches 254 in the material layers 250. The operation 208 may have one or more adjustable process parameters, such as the depth of etching into the material layers 250, the etching direction (e.g., isotropic or anisotropic), the etching selectivity between the resist pattern 252 and the material layers 250, the etching selectivity between different layers of the material layers 250, the vertical profile (e.g., the sidewall angle and the aspect ratio) of the trenches 254. In the present embodiment, the depth of etching is an adjustable process parameter with a second workable range. The second workable range may include a number of discrete depths. For example, the second workable range may include a minimum depth, a maximum depth, and one or more depths between the minimum depth and the maximum depth. These depths may be provided by a semiconductor manufacturer based on empirical data and available etching recipes or by a designer during experimental phases. In the embodiment as shown in FIG. 3, the second workable range includes a minimum depth of D1 (e.g., 180 nm), a maximum depth of D3 (e.g., 220 nm), and an intermediate depth of D2 (e.g., 200 nm) as an example. In an alternative embodiment, the second workable range may be specified as a continuous range between a minimum depth and a maximum depth, and further include a delta depth for tuning the depths in this range.

At the operation 210, the method 200 simulates a step of stripping the resist pattern 252 and cleaning the wafer with the material layers 250 thereon. The operation 210 may include one or more adjustable process parameters accounting for impact of the stripping and cleaning processes on the material layers 250. For example, the stripping and cleaning chemicals may change (e.g., widen and/or deepen) the profile of the trenches 254.

At the operation 212, the method 200 simulates a step of depositing a material 256 into the trenches 254 and over the material layer 250. The operation 212 may have one or more adjustable process parameters, such as the thickness of the material 256 over the material layer 250, and optical, chemical, electrical, thermal, and mechanical properties of the material 256. The optical properties of the material 256 include refraction index, extinction coefficient, reflectivity, scattering, transmittance, absorptivity, and/or other optical properties. The electrical properties of the material 256 include dielectric constant, electrical conductivity, permittivity, capacitance, and/or resistance.

Particularly, in the present embodiment of simulating the fabrication of alignment marks, the refraction index of the material 256 is an adjustable process parameter in the operation 212 with a third workable range. The third workable range may include a number of discrete refraction indexes. For example, the third workable range may include a minimum refraction index, a maximum refraction index, and one or more refraction indexes between the minimum refraction index and the maximum refraction index. These refraction indexes may be provided by a semiconductor manufacturer based on empirical data and available film materials or by a designer during experimental phases. In the embodiment as shown in FIG. 3, the third workable range includes a minimum refraction index of R1 (e.g., 2.70), a maximum refraction index of R3 (e.g., 2.80), and an intermediate refraction index of R2 (e.g., 2.75) as an example. In an alternative embodiment, the third workable range may be specified as a continuous range between a minimum refraction index and a maximum refraction index, and further include a delta refraction index for tuning the refraction indexes in this range. In the present embodiment, at the end of the operation 212, a structure with one or more alignment marks is created as a simulation model.

At operation 214, the method 200 simulates a step of testing the structure which is one or more alignment marks in the present embodiment. The operation 214 may simulate a light directed at the top surface of the structure and check the properties of the reflected light such as direction, signal strength, and scattering.

In an alternative embodiment for simulating the fabrication of an interconnect structure, the operations 204, 206, 208, and 210 may remain similar or the same as discussed above. The operation 212 may simulate the step of depositing a conductive layer (or film) 256 into the trenches 254. To further this embodiment, the adjustable process parameter in the operation 212 may relate to the electrical properties (e.g., resistivity or capacitance) of the conductive layer 256, and the operation 214 may test the electrical properties of the interconnect structure such as the resistance and/or the coupling capacitance thereof.

Figure 6:
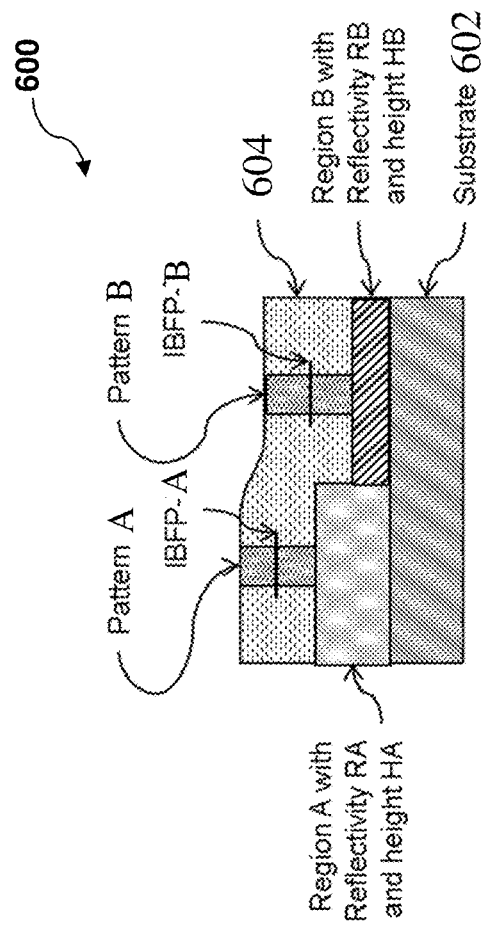

At the operation 216, the method 200 determines whether or not the simulated structure meets certain criteria. For example, a criterion may be a threshold of reflectivity of the structure having alignment marks. The threshold may be determined by a user of the simulation tool based on requirements of a piece of optical equipment, such as a metrology tool for measuring alignment or overlay during wafer fabrication. Alternatively, a criterion may be a globally optimal reflectivity, a small variation of reflectivity that allows a wide variation of one or more process parameters, and/or the smallest differences of focus at different parts of the structure with uneven topography. FIGS. 4-6 illustrate some passing criteria that may be implemented by the operation 214 according to some embodiments of the present disclosure.

Referring to FIG. 4, a curve 402 represents the simulation results as the process parameters (conditions) are adjusted during the simulation of the method 100 or 200. A peak of the simulation results, as shown by the circle 404, exists at a process condition A0 (representing a set of values of the process parameters), and provides a maximum value B0 of the results. The methods 100 and 200, such as illustrated in the FIGS. 1-3, may keep track of the simulation results in iterations. Therefore, the methods 100 and 200 may build the curve 402 and locate the peak value B0 and the corresponding process condition A0. The peak value B0 is also referred to as the "globally optimal" value in the present disclosure because it is better than any other values on the curve 402.

Referring to FIG. 5, another criterion that may be implemented by the operation 214 is also illustrated with the curve 402. In this example, a process condition A1 results in a locally optimal simulation result B1, as shown by the circle 406. The result B1 is "locally optimal" because it is better than other results in its vicinity but it is not as good as the globally optimal result B0. FIG. 5 also illustrates a result B2 that is not as good as the result B1 but nonetheless acceptable. To reach a result between B1 and B2 inclusive, process conditions can vary from a process condition A2 to a process condition A3, which represents a wide range of variations of the process conditions. Since the result only changes slightly when the process conditions vary between A2 and A3, the result is also referred to as being "insensitive" to the process variations (or "insensitive" to the process parameters). In this example, the range of process variations around the process condition A1 is wider than that around the process condition A0 to achieve the same fluctuation in the results. With the wider range of process variations, the process window is larger at the actual semiconductor manufacturer facility, which means that the device will be easier to manufacture. As discussed earlier, the methods 100 and 200 may build the curve 402 and locate the locally optimal result B1 and the corresponding process conditions A1, A2, and A3. In some embodiments, the locally optimal result B1 may also be globally optimal.

Referring to FIG. 6, another criterion that may be implemented by the operation 214 is illustrated. A structure 600 is built at the end of operation 212 of the method 200 (FIG. 3). The structure 600 includes a substrate 602 and two regions A and B on the substrate 602. The region A has a first reflectivity RA and a height HA. The region B has a second reflectivity RB and a height HB. Either the reflectivity or the height or both are different between regions A and B. Particularly, the region A is higher than the region B in the example. The structure 600 further includes a layer 604 on the regions A and B. The structure 600 further includes two patterns, pattern A and pattern B, embedded in the layer 604 and disposed on the regions A and B respectively. In an embodiment, the layer 604 is a photoresist, and the patterns A and B are latent resist patterns. One quality measure of the structure 600 is the difference between the focus levels of the patterns A and B during the lithography imaging processes. The difference may be caused by the different reflectivity and/or the different heights in the regions A and B. In the example shown in FIG. 6, the best focus level of pattern A is IBFP-A, and the best focus level of pattern B is IBFP-B which is different from IBFP-A. A structure 600 with a minimum difference in these focus levels may be desirable.

Referring back to FIG. 3, if the operation 216 determines that the current simulation result does not meet the criteria, the method 200 goes back to the operation 204 to start another iteration of the simulation. In this new iteration, the method 200 adjusts one of the adjustable process parameters such as the thickness of the photoresist layer at the operation 204, the etching depths at the operation 208, and the refraction index and/or extinction coefficient of the deposited film at the operation 212. In an embodiment, the method 200 implements a simulation loop controller similar to the controller shown in FIG. 2. On the other hand, if the operation 216 determines that the current simulation result meets the criteria, such as being a globally optimal result or a locally optimal result with a wide range of process variations, the method 200 finishes the simulation process at the operation 218.

At the operation 218, the method 200 may output a set of values for the process parameters, which may be used by a semiconductor manufacturer facility for fabricating a wafer.

Figure 7:
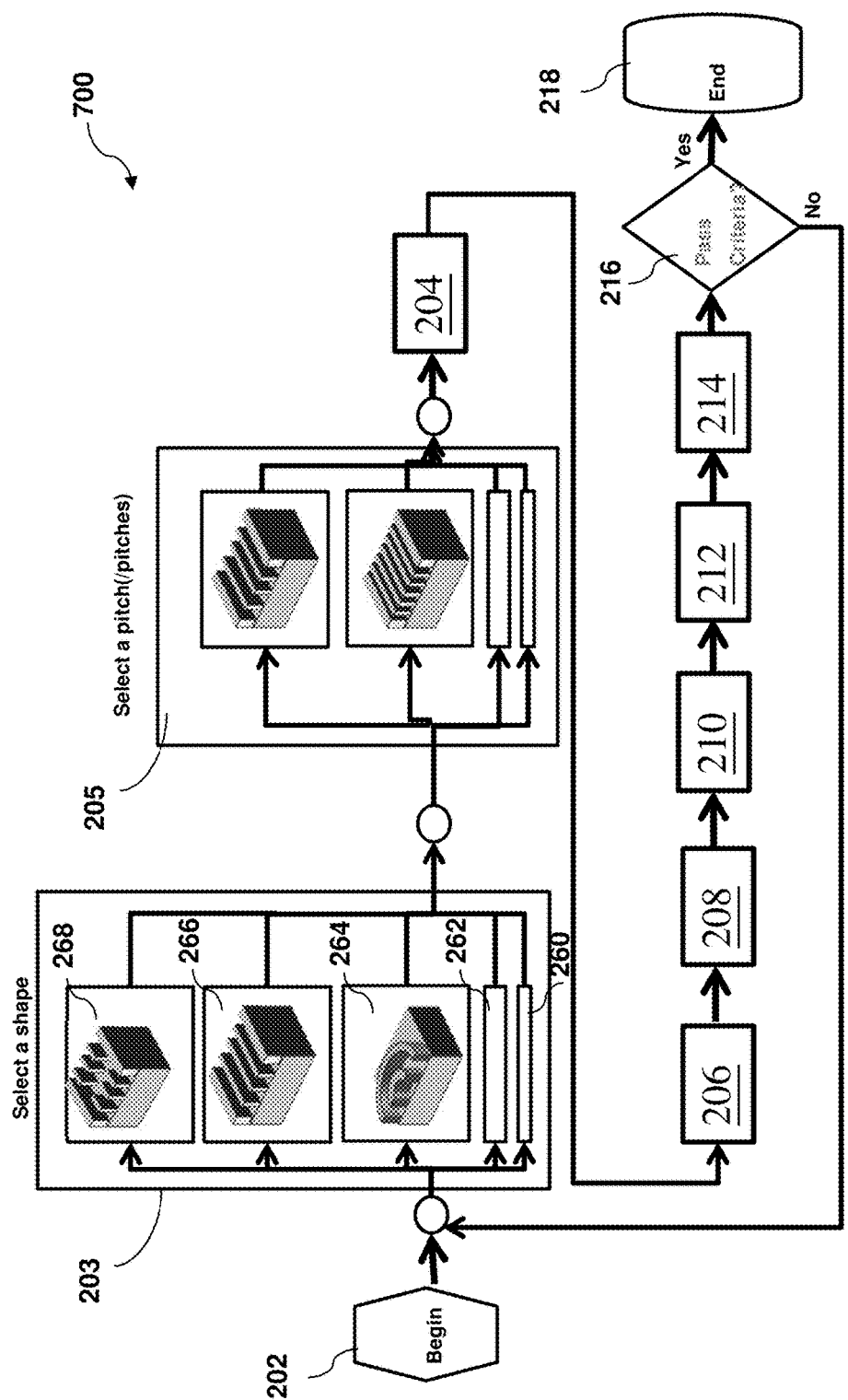
FIG. 7 illustrates another flow chart of a wafer simulation process, according to aspects of the present disclosure.

FIG. 7 illustrates a flow chart of a method 700 for simulating the fabrication of one or more alignment marks on a wafer. The method 700 is an embodiment of the method 200. The method 700 includes operations 202, 203, 205, 204, 206, 208, 210, 212, 214, 216, and 218. The operations 204 through 218 have been discussed above. The operations 203 and 205 are performed before the operation 204, and are discussed below.

At the operation 203, the method 700 selects a shape for the alignment mark. For example, the alignment mark may comprise narrow bar shapes 260, wide bar shapes 262, concentric arcs 264, parallel mixed narrow and wide bar shapes 266 with the same lengths, and parallel mixed narrow and wide bar shapes 268 with different lengths. At the operation 205, the method 700 selects a pitch or pitches for the selected shapes of the alignment mark. Both the shapes and the pitches may be provided by a semiconductor manufacturer or by a designer during experimental phases. The shapes and pitches of the alignment mark are carried out by subsequent operations such as the photolithography operation 206 and the etching operation 208. At different iterations of the method 700, a different shape of the alignment mark and/or a different pitch of the alignment mark may be tried for reaching a design target at the operation 216.

Figure 8:
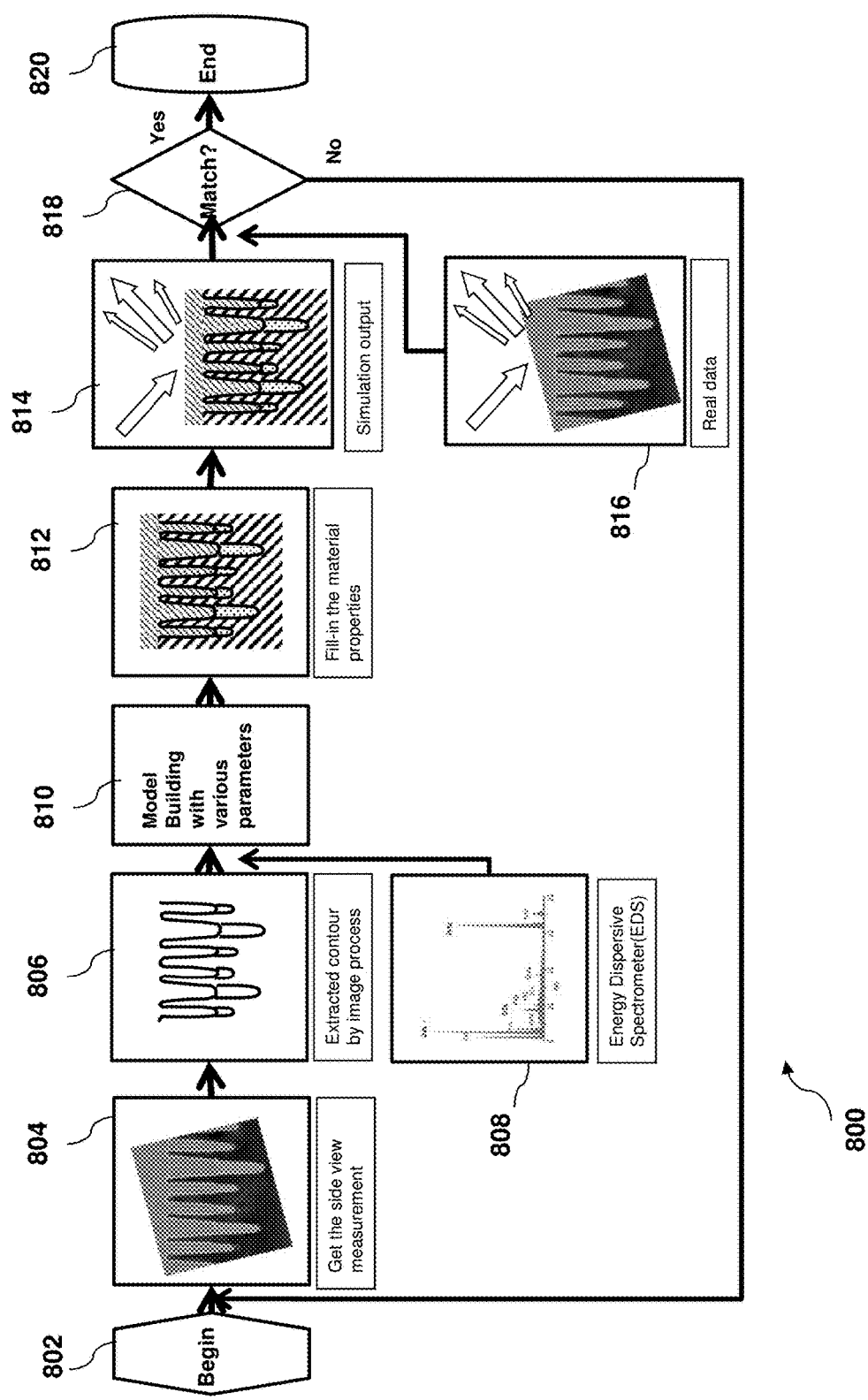
FIG. 8 illustrates a flow chart of building a simulation model for a wafer simulation process, according to aspects of the present disclosure.

FIG. 8 illustrates a flow chart of a method 800 for building a simulation model for a semiconductor structure. Embodiments of the method 800 may be used for one or more operations in the method 100, 200, or 700. For example, an embodiment of the method 800 may be used for creating a simulation model for the operation 212. In wafer simulation process, it is highly desirable to create a simulation model that closely matches the real devices, which may be accomplished by embodiments of the method 800. The method 800 includes operations 802, 804, 806, 808, 810, 812, 814, 816, 818, and 820. Additional operations can be provided before, during, and after the method 800, and some operations described can be replaced, eliminated, or moved around for additional embodiments of the method. The operations 802 through 820 are discussed below.

At the operation 802, the method 800 initializes a simulation process. At the operation 804, the method 800 takes as input an image of a sample of a device. In an embodiment, the image is obtained by Scanning Electron Microscope (SEM) or Transmission Electron Microscope (TEM) analysis of another wafer that has devices built on. In another embodiment, the image is a result from another computer simulation. In yet another embodiment, the image is a 3-D model of a device. The image contains or closely matches a real device.

At the operation 806, the method 800 extracts a contour of various trenches of the sample by using an image processing tool. The method 800 may adjust some parameters of the image processing tool, such as grayscale, view (or capture) angle, and contrast, in order to improve the extracted contour. The extracted contour closely matches what trenches would be in a real device. At the operation 808, the method 800 analyzes the material of the sample by using a tool with energy dispersive spectrometer (EDS), which provides the compositional information of the material filling in the trenches.

At the operation 810, the method 800 builds a simulation model of the device having trenches lined with the extracted contour. At the operation 812, the method 800 completes the simulation model of the device by filling the trenches with material composition obtained from the operation 808. At the operation 814, the method 800 simulates a step of testing the device with the simulation model and produces a first test result. At the operation 816, the method 800 obtains a second test result by testing the real device. At the operation 818, the method 800 compares the first and second results. If the results match within a margin (e.g., within 5%), the method 800 finishes the process of building the simulation model at the operation 820. The simulation model may then be used by other methods such as the methods 100, 200, and 700. For example, the simulation model may substitute for one or more operations 208, 210, and 212 in FIG. 3. On the other hand, if the results do not match at the operation 818, the method 800 goes back before the operation 804 by changing one or more process parameters in the operations 804, 806, 808, and/or 810. For example, it may obtain a different image by, e.g. a different cross-section and/or a different contrast. For example, it may change the image processing tool's parameters (e.g., grayscale, rows, columns, capture angles) in extracting the contour. After changing one or more process parameters, the method 800 re-builds the simulation model at the operation 812 and re-tests the simulation model at the operation 814. Again, the method 800 compares the simulation result and the real test result (from the operation 816) after the operation 818. The above process repeats until the simulation result matches the real result within a specified margin.

Figure 9:
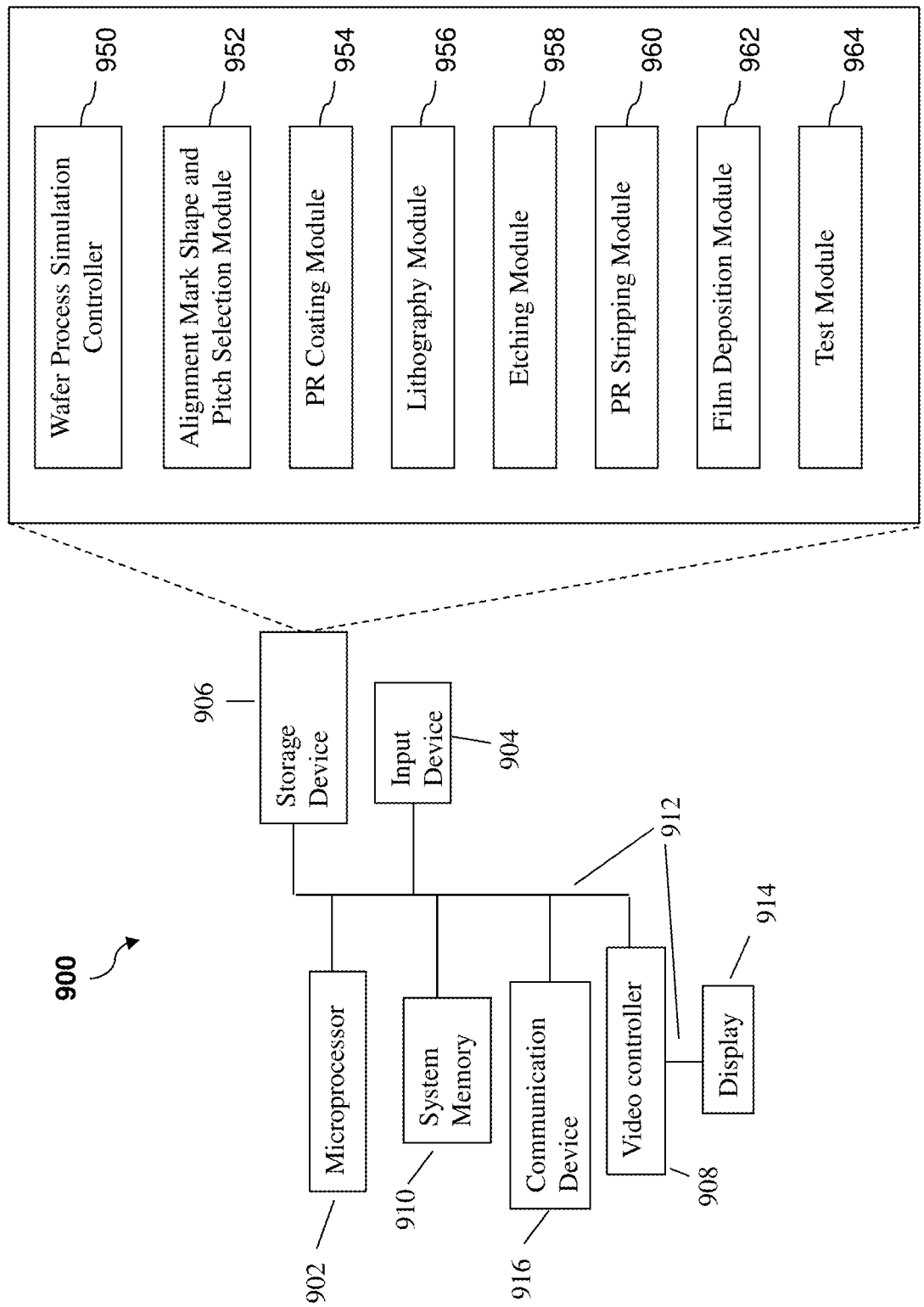
FIG. 9 illustrates a computerized wafer process simulation tool, according to aspects of the present disclosure.

In an embodiment, the various operations of the method 100, 200, 700, and 800 are implemented and executed on a computerized wafer process simulation tool (or simulator) 900, such as illustrated in FIG. 9. Referring to FIG. 9, the simulation tool 900 includes a microprocessor 902, an input device 904, a storage device 906, a video controller 908, a system memory 910, a display 914, and a communication device 916 all interconnected by one or more buses 912. The communication device 916 could be a modem, network card, or any other device to enable the simulation tool 900 to communicate with other tools. The storage device 906 could be a floppy drive, hard drive, CD-ROM, optical drive, flash drive, or any other form of non-transitory computer storage medium that may contain computer-executable instructions (or computer programs). In addition, the storage device 606 may be capable of receiving a floppy disk, CD-ROM, DVD-ROM, flash driver, or any other form of computer-readable medium that may contain computer-executable instructions. The computer-executable instructions include various modules implementing wafer fabrication processes. In the present embodiment, the various modules include a wafer process simulation controller 950, an alignment mark shape and pitch selection module 952, a photoresist coating module 954, a lithography module 956, an etching module 958, a photoresist stripping module 960, a film deposition module 962, and a test module 964.

In an embodiment, the wafer process simulation controller 950 contains computer instructions for executing simulation loop control, such as illustrated in FIGS. 2 and 3; the alignment mark shape and pitch selection module 952 contains computer instructions for executing the operations 203 and/or 205 (FIG. 7); the photoresist coating module 954 contains computer instructions for executing the operation 204 (FIG. 2); the lithography module 956 contains computer instructions for executing the operation 206 (FIG. 2); the etching module 958 contains computer instructions for executing the operation 208 (FIG. 2); the photoresist stripping module 960 contains computer instructions for executing the operation 210 (FIG. 2); the film deposition module 962 contains computer instructions for executing the operation 212 (FIG. 2); and the test module 964 contains computer instructions for executing the operation 214 (FIG. 2). By implementing the various modules, the simulation tool 900 is able to simulate multiple process parameters pseudo-simultaneously as discussed above, to find globally optimal results, and/or to find locally optimal results that are insensitive to process variations. This speeds up the optimization process of the simulation tool 900.

Although not intended to be limiting, one or more embodiments of the present disclosure provide many benefits to semiconductor fabrication processes. For example, embodiments of the present disclosure enable a wafer process simulator to efficiently optimize multiple process parameters to meet a target goal. The target goal can be a globally optimal result or a result that permits a wide range of process variations. The former leads to the best-performing devices and the latter leads to the most robust fabrication processes.

In one exemplary aspect, the present disclosure is directed to a method. The method includes establishing a simulation process for simulating fabrication of a structure on a wafer. The simulation process includes multiple simulation steps for simulating multiple wafer fabrication steps respectively, and further includes a step of testing the structure that produces a result representing quality of the structure. Each of the simulation steps has a respective adjustable process parameter. The method further includes specifying a respective workable range for each process parameter and running the simulation process in iterations using a wafer process simulator until the result becomes optimal. During the running of the simulation process, every two consecutive iterations either adjust two different process parameters within their workable ranges or adjust a same process parameter at opposite directions within its workable range.

In another exemplary aspect, the present disclosure is directed to a non-transitory computer readable medium comprising computer readable instructions to perform a simulation process for simulating fabrication of an alignment mark on a wafer. The computer readable instructions provide instructions for producing a simulation model of the alignment mark, which includes simulating a photolithography process with one or more photolithography-related process parameters including a thickness of a photoresist layer, simulating an etching process with one or more etching-related process parameters including a depth of the etching process, and simulating a film deposition process with deposition-related process parameters including a refraction index of a film. The computer readable instructions further provide instructions for simulating a test performed on the simulation model of the alignment mark, and checking a result of the test with respect to a target. On condition that the result does not meet the target, the computer readable instructions further provide instructions for producing the simulation model of the alignment mark by varying a first process parameter that is one of: the photolithography-related process parameters, the etching-related process parameters, and the deposition-related process parameters; simulating the test performed on the simulation model; and checking the result of the test with respect to the target.

In yet another exemplary aspect, the present disclosure is directed to an apparatus comprising a non-transitory computer readable medium encoded with a computer program that, when executed, performs the steps of selecting a shape of an alignment mark; selecting a pitch of the alignment mark; producing a simulation model of the alignment mark; simulating a test performed on the simulation model of the alignment mark; and checking a result of the test with respect to a target. The producing of the simulation model includes simulating a photolithography process with one or more photolithography-related process parameters including a thickness of a photoresist layer, simulating an etching process with one or more etching-related process parameters including a depth of the etching process, and simulating a film deposition process with deposition-related process parameters including a refraction index of the film.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    establishing a simulation process for simulating fabrication of a structure on a wafer, wherein the simulation process includes multiple simulation steps for simulating multiple wafer fabrication steps respectively, and further includes a step of testing the structure that produces a result representing quality of the structure, wherein each of the simulation steps has a respective adjustable process parameter;
    specifying a respective workable range for each process parameter; and
    running the simulation process in iterations using a wafer process simulator until the result becomes optimal, wherein every two consecutive iterations either adjust two different process parameters within their workable ranges or adjust a same process parameter at opposite directions within its workable range.

2. The method of claim 1, wherein the running of the simulation process includes:
    increasing a current value of a process parameter by a first delta, resulting in an increased value;
    running the simulation process with the increased value of the process parameter;
    checking if the result improves;
    on condition that the result improves, replacing the current value of the process parameter with the increased value;
    otherwise, performing the following:
        decreasing the current value of the process parameter by the first delta, resulting in a decreased value;
        running the simulation process with the decreased value of the process parameter;
        checking if the result improves; and
        on condition that the result improves, replacing the current value of the process parameter with the decreased value.

3. The method of claim 1, wherein the wafer fabrication steps include a step of coating a photoresist layer over the wafer, and the respective adjustable process parameter is a thickness of the photoresist layer.

4. The method of claim 1, wherein the wafer fabrication steps include a step of etching one or more layers on the wafer, and the respective adjustable process parameter is a depth of the etching.

5. The method of claim 1, wherein the wafer fabrication steps include a step of depositing a layer on the wafer, and the respective adjustable process parameter is a refraction index of the layer.

6. The method of claim 1, wherein the wafer fabrication steps include a step of depositing a conductive layer on the wafer, and the respective adjustable process parameter relates to resistivity or capacitance of the conductive layer.

7. The method of claim 1, wherein the structure on the wafer is an alignment mark and the result of the simulation process includes reflectivity of the alignment mark.

8. The method of claim 7, wherein the simulation process further includes:
    selecting a shape of the alignment mark; and
    selecting a pitch of the alignment mark.

9. The method of claim 1, wherein the wafer fabrication steps include a step of depositing a material into trenches on the wafer, and a simulation model of this step is built by a process that includes:
    extracting, using an image processing tool, a contour of the trenches from another wafer that has been fabricated;
    analyzing material in the trenches from the another wafer;
    creating the simulation model with the contour and the material;
    running a simulation with the simulation model, resulting in a first result;
    performing a test on the another wafer, resulting in a second result; and
    comparing the first and second results.

10. The method of claim 9, on condition that the results of the simulation and the test do not match within a user-specified margin, further comprising:
    repeating the extracting of the contour after changing parameters of the image processing tool to include different grayscale settings; and
    repeating the steps of creating the simulation model, running the simulation, performing the test, and comparing the first and second results.

11. A non-transitory computer readable medium comprising computer readable instructions to perform a simulation process for simulating fabrication of an alignment mark on a wafer, the computer readable instructions providing instructions for:
    producing a simulation model of the alignment mark, which includes:
       selecting a shape of the alignment mark;
       selecting a pitch of the alignment mark;
       simulating a photolithography process with one or more photolithography-related process parameters including a thickness of a photoresist layer,
       simulating an etching process with one or more etching-related process parameters including a depth of the etching process, and
       simulating a film deposition process with deposition-related process parameters including a refraction index of a film;
    simulating a test performed on the simulation model of the alignment mark;
    checking a result of the test with respect to a target; and
    on condition that the result does not meet the target, performing iterations of:
       producing the simulation model of the alignment mark by varying a first process parameter that is one of: the photolithography-related process parameters, the etching-related process parameters, and the deposition-related process parameters, wherein the producing of the simulation model of the alignment mark further includes selecting a different shape or a different pitch of the alignment mark;
       simulating the test performed on the simulation model; and
       checking the result of the test with respect to the target.

12. The non-transitory computer readable medium of claim 11, wherein if an iteration of producing, simulating, and checking improves the result of the test, a second process parameter different from the first process parameter is varied in next iteration.

13. The non-transitory computer readable medium of claim 11, wherein the varying of the first process parameter is:
    increasing a current value of the first process parameter; or
    decreasing the current value of the first process parameter.

14. The non-transitory computer readable medium of claim 11, wherein the result meets a target when the result is locally optimal with respect to a process parameter that is one of: the photolithography-related process parameters, the etching-related process parameters, and the deposition-related process parameters.

15. The non-transitory computer readable medium of claim 11, wherein the result meets a target when the result is insensitive to variations of a process parameter that is one of: the photolithography-related process parameters, the etching-related process parameters, and the deposition-related process parameters.

16. The non-transitory computer readable medium of claim 11, wherein the test performed on the simulation model of the alignment mark is a reflectivity test.

17. The non-transitory computer readable medium of claim 11, wherein the test performed on the simulation model of the alignment mark is a focus difference test.

18. The non-transitory computer readable medium of claim 11, wherein the result meets a target when the result is globally optimal with respect to a process parameter that is one of: the photolithography-related process parameters, the etching-related process parameters, and the deposition-related process parameters.

19. An apparatus comprising a non-transitory computer readable medium encoded with a computer program that, when executed, performs the steps of:
    selecting a shape of an alignment mark;
    selecting a pitch of the alignment mark;
    producing a simulation model of the alignment mark;
    simulating a test performed on the simulation model of the alignment mark;
    checking a result of the test with respect to a target; and
    if the result of the test does not meet the target, selecting a different shape or a different pitch of the alignment mark,
    wherein the producing of the simulation model includes:
       simulating a photolithography process with one or more photolithography-related process parameters including a thickness of a photoresist layer,
       simulating an etching process with one or more etching-related process parameters including a depth of the etching process, and
       simulating a film deposition process with deposition-related process parameters including a refraction index of a film.

20. The apparatus of claim 19, wherein the result meets a target when the result is insensitive to variations of a process parameter that is one of: the photolithography-related process parameters, the etching-related process parameters, and the deposition-related process parameters.

\* \* \* \* \*